US006924241B2

(12) United States Patent
Lee

(10) Patent No.: US 6,924,241 B2
(45) Date of Patent: Aug. 2, 2005

(54) METHOD OF MAKING A SILICON NITRIDE FILM THAT IS TRANSMISSIVE TO ULTRAVIOLET LIGHT

(75) Inventor: Tai-Peng Lee, Milpitas, CA (US)

(73) Assignee: ProMOS Technologies, Inc., Hsin Chu (TW)

( * ) Notice: Subject to any disclaimer, the term of this patent is extended or adjusted under 35 U.S.C. 154(b) by 67 days.

(21) Appl. No.: 10/373,917

(22) Filed: Feb. 24, 2003

(65) Prior Publication Data

US 2004/0166696 A1 Aug. 26, 2004

(51) Int. Cl.[7] .................. H01L 21/31; H01L 21/336
(52) U.S. Cl. ................. 438/792; 439/257; 439/791; 439/952
(58) Field of Search ..................... 438/636, 952, 438/792, 791, 958, 257

(56) References Cited

U.S. PATENT DOCUMENTS

| 4,618,541 | A | | 10/1986 | Forouhi et al. |
|---|---|---|---|---|
| 5,260,236 | A | | 11/1993 | Petro et al. |
| 5,883,001 | A | * | 3/1999 | Jin et al. ............... 438/624 |
| 6,472,283 | B1 | | 10/2002 | Ishida et al. |
| 6,475,895 | B1 | | 11/2002 | Mei et al. |

OTHER PUBLICATIONS

Wang et al.; "Characterization of a High Quality And UV–Transparent PECVD Silicon Nitride Film For Non-Volatile Memory Applications"; SPIE vol. 2335; Oct. 20–21,1994, Austin, Texas; pp. 282–290.

Lee et al.; "Characterization of UV Transparent Films for FLASH Devices"; DCMIC Conference; Feb. 25, 2002; pp. 81–88.

Zheng et al.; "Characterization and In–line Control of UV–Transparent Silicon Nitride Films For Passivation of FLASH Devices"; SPIE Proceedings vol. 2876; Oct. 16–Oct. 18, 1996, Austin, Texas; pp. 63–70.

* cited by examiner

Primary Examiner—Michael Trinh
(74) Attorney, Agent, or Firm—MacPherson Kwok Chen & Heid LLP; David S. Park

(57) ABSTRACT

A method for producing an ultraviolet light (UV) transmissive silicon nitride layer in a plasma enhanced chemical vapor deposition (PECVD) reactor is presented. The UV transmissive film is produced by reducing, in comparison to a standard silicon nitride process, a flow rate of the silane and ammonia gas precursors to the PECVD reactor, and significantly increasing a flow rate of nitrogen gas to the reactor. The process reduces the concentration of Si—H bonds in the silicon nitride film to provide UV transmissivity. Further, the amount of nitrogen in the film is greater than in a standard PECVD silicon nitride film, and as a percentage constitutes a greater part of the film than silicon. The film has excellent step coverage and a low number of pinhole defects. The film may be used as a passivation layer in a UV erasable memory integrated circuit.

10 Claims, 4 Drawing Sheets

| Parameters | Silicon Nitride | UV Nitride | UV Oxynitride | Oxynitride |
|---|---|---|---|---|
| Deposition Rate, A/min | 1850 | 550 | 1050 | 2400 |
| Thickness non U% | 1.00% | 2.80% | 0.80% | 0.75% |
| Refractive Index (633nm) | 1.9981 | 1.9075 | 1.7591 | 1.7733 |
| Stress, dynes/cm^2 | −2.30E+09 | −2.70E+09 | −4.00E+08 | −8.50E+08 |
| UV Transmittance | 0% | 80% | 93% | 60% |
| 100:1 BOE etch rate | 40 A/min | 26 A/min | 99 A/min | 106 A/min |
| N / Si Ratio | 0.7 | 1.1 | 0.8 | 1.1 |

METHOD OF MAKING A SILICON NITRIDE FILM THAT IS TRANSMISSIVE TO ULTRAVIOLET LIGHT

FIELD OF THE INVENTION

The present invention relates to the fabrication of integrated circuit structures. More particularly, this invention relates to a plasma-enhanced chemical vapor deposition of an ultraviolet-light-transmissive silicon nitride passivation layer in an erasable memory integrated circuit device.

BACKGROUND

In the construction of integrated circuit devices, a topside or "passivation" layer of a dielectric material is conventionally provided over the underlying layers comprising the integrated circuit structure. This layer, in addition to functioning as an insulation layer, acts to protect the underlying structure from moisture and ion contamination that can damage or destroy the structure by causing corrosion and electrical shorts.

Silicon nitride ($Si_3N_4$) is known as a satisfactory insulation material for forming such a passivation layer. Silicon nitride is known to have a high resistance to moisture and hydrogen penetration. Moreover, the diffusivity of various impurities, such as sodium, is much lower in silicon nitride than in other insulators, such as silicon dioxide. Thus, integrated circuits made with a silicon nitride passivation layer are less susceptible to ionic contamination problems.

In some memory integrated circuits, such as erasable programmable read only memories (EPROMs) and FLASH memories, ultraviolet (UV) light is irradiated on the topmost surface of the integrated circuit to erase underlying memory cells. In such devices, electric charge is stored on an electrically insulated floating gate. The UV light excites the electrons trapped on the floating gate, allowing them to escape off the floating gate to the overlying control gate or the underlying substrate.

The use of UV light to erase the internal memory cells of the integrated circuit implies that the passivation layer overlying the memory cells must be transmissive to the UV light, in order to allow the device to be erased properly. Silicon nitride films deposited by the usual method of plasma enhanced chemical vapor deposition (PECVD) are opaque to UV light. In the past, therefore, silicon nitride was considered unsuitable for use as the passivation layer on such devices, despite its outstanding performance as a moisture and contamination barrier.

Some practitioners have reported silicon nitride films that are transparent to UV radiation. However, a greater understanding of the reaction and the film is necessary, so that a better process and film may be created.

SUMMARY

In accordance with the present invention, a method is disclosed for depositing a high UV transmittance silicon nitride film using a PECVD process.

The present inventor has determined that it is the density of Si—H bonds in silicon nitride films produced by PECVD processes that controls transmissivity in the UV range.

An exemplary method within the present invention for making a high UV transmittance silicon nitride film for an UV erasable EPROM or FLASH memory device includes reducing the concentration of Si—H bonds in the film, which would otherwise absorb the UV light used to erase the memory. In this instance, the rate of flow of silane and ammonia to the PECVD reactor is reduced compared to a PECVD process that would produce a typical opaque silicon nitride film. Furthermore, the flow rate of nitrogen to the PECVD reactor is significantly increased, e.g., by at least fifty times, which encourages the formation of Si—N and N—H bonds compared to Si—H bonds.

The resulting UV transmissive PECVD silicon nitride film has a transmissivity of at least 60%, and is nitrogen rich. For instance, the amount of nitrogen in the film may be at least about 33% more than in a standard opaque PECVD silicon nitride film, which is reflective of the desired formation of Si—N and N—H bonds, and the reduced number of Si—H bonds. Further, the film produced using this method has a low occurrence of pinhole defects, and thereby provides a good barrier to prevent moisture penetration. The film also has excellent step coverage, and a low etch rate in a 100:1 buffered oxide etch solution. The low wet etch rate indicates that the film is denser than conventional PECVD silicon nitride films, and thus can serve as an excellent passivation film. The film also has a low intrinsic stress, and therefore is resistant to peeling or cracking.

These and other features of the present invention will be illustrated further by the following detailed description, and the accompanying drawings, of the exemplary embodiments.

DETAILED DESCRIPTION

Figure 1:
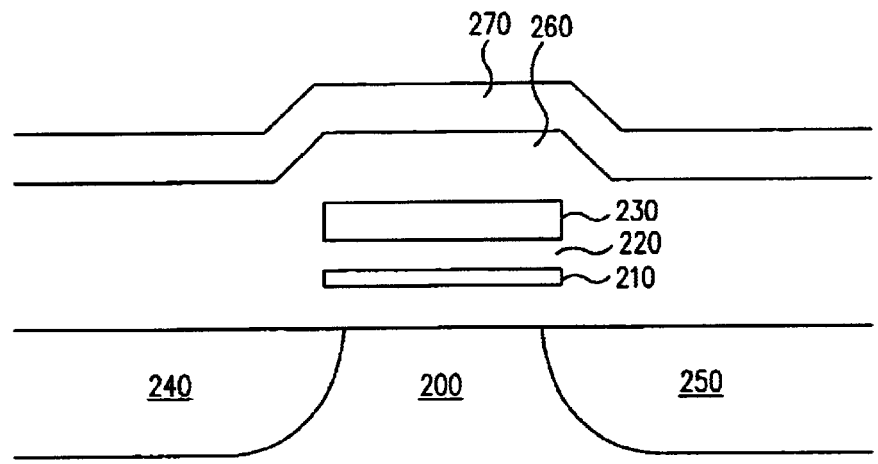
FIG. 1 is a simplified diagram of an exemplary integrated circuit structure, to which the present invention may by applied.

It has been found that the presence of Si—H bonds in the silicon nitride film reduces its transmittance to ultra-violet (UV) radiation, more than simply the presence of excess Si. The UV light is absorbed because the Si—H bond has a low band gap energy, at about 1.8 eV. Therefore, reducing the absorption of the UV light requires reducing the concentration of Si—H bonds in the film, because the Si—H bonds absorb light at the 254 nm wavelength (the wavelength of the mercury UV light typically used to erase EPROM devices).

The invention includes a method for depositing a high UV transmittance silicon nitride film using a plasma process in a PECVD reactor. The method lowers the concentration of Si—H bonds by, among other things, lowering the amount of silane gas supplied to the plasma reactor. This reduces the amount of unreacted Si, thus reducing the number of Si dangling bonds. Further, the amount of ammonia provided to the reactor is decreased, thus reducing the amount of hydrogen available to the reaction.

The method also dramatically increases the amount of nitrogen provided to the PECVD reactor, in order to passivate any Si dangling bonds with nitrogen instead of hydrogen. The UV transmissive PECVD silicon nitride film thereby contains a much larger amount of nitrogen than the conventional opaque PECVD silicon nitride films.

For instance, a conventional UV opaque PECVD silicon nitride film has a stoichiometry of $Si_3N_{2.125}H_{1.125}$. Such a film may be produced in a PECVD process having a silane ($SiH_4$) flow rate of 500 sccm, and a gas flow ratio of 1 $SiH_4$:8 $NH_3$:3 $N_2$. The reactor used is a CONCEPT ONE dual-frequency parallel plate PECVD reactor from Novellus Systems, Inc. of San Jose, Calif. (Additional detail concerning the CONCEPT ONE reactor is provided below.)

Note that, in this conventional process, the flow rate of the nitrogen is less than the flow rate of the ammonia. Also note that, as is expected for silicon nitride films produced by PECVD, the stoichiometry of the PECVD silicon nitride is not a match to pure silicon nitride ($Si_3N_4$). This is apparent, for instance, from the relatively lower amount of nitrogen in the film and the presence of hydrogen in the film. The amount of nitrogen in the conventional film is less than the amount of silicon. The concentration of UV absorbing Si—H bonds is 1e22 bonds/$cm^3$.

A process for producing a high UV transmissive PECVD silicon nitride film produced in accordance with the present invention uses a much lesser silane flow rate than in the conventional process, a much lesser ammonia flow rate, and a much greater flow rate of nitrogen. For instance, a silane flow rate of 150 sccm may be used, with gas flow ratios of 1 $SiH_4$:5 $NH_3$:100 $N_2$. In this embodiment, the nitrogen flow rate is significantly increased so as to constitute the overwhelming portion of the gas flow. The UV transmissive PECVD silicon nitride film so produced has a concentration of Si—H bonds of 2e21 bonds/$cm^3$, which is significantly lower than in the conventional opaque PECVD silicon nitride film. Further, the film has a UV transmissivity greater than 60%, in this case about 80%, and is nitrogen rich. The film had stoichiometry of $Si_3N_{3.3}H_{1.3}$. Note that the concentration of nitrogen in the UV transmissive PECVD silicon nitride film of the present invention is actually greater than the concentration of silicon, which is much different than the conventional PECVD silicon nitride film mentioned above.

Further detail of the exemplary process will now be provided, followed by presentation of some test data.

FIG. 1 shows a simplified diagram of a portion of an integrated circuit device upon which the present invention can be practiced. The diagram shows a semiconductor substrate 200, upon which an integrated circuit structure has been fabricated. In this case, the integrated circuit is a UV erasable FLASH memory cell, but readers should appreciate that the present invention is not limited to the particular integrated circuit embodiments discussed herein.

The integrated circuit structure may include, for example, a floating gate 210, followed by a layer of interpoly dielectric 220, followed by a control gate 230. The floating gate spans a channel formed between a doped source region 240 and a doped drain region 250, to form a transistor. On top of the control gate is an additional layer of interlayer dielectric 260, upon which it is desired to form the passivation layer 270. The present invention includes forming passivation layer 270 of UV transmissive PECVD silicon nitride.

Figure 2A:
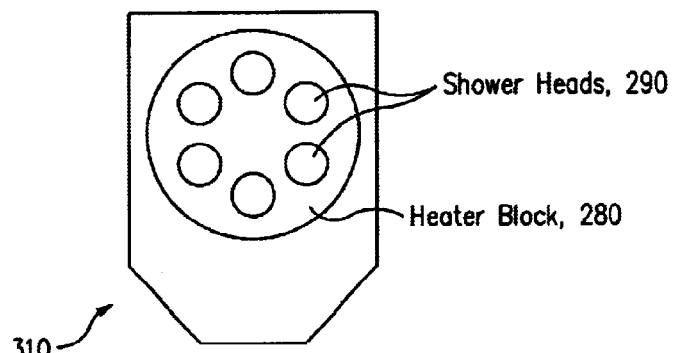
FIG. 2a shows a top down view of an exemplary apparatus, upon which the process according to an embodiment of the present invention, may be practiced.
Figure 2B:
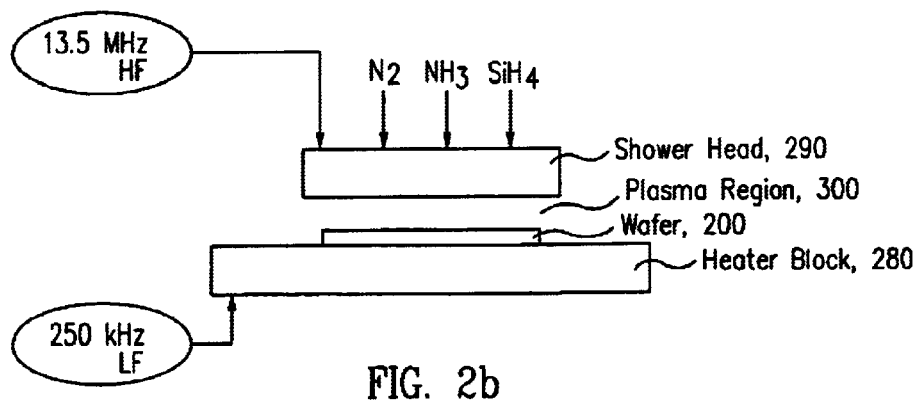
FIG. 2b shows a side view of the apparatus.

The invention can be implemented on any plasma enhanced chemical vapor deposition (PECVD) system. As mentioned, the process can be implemented using a CONCEPT ONE dual frequency parallel plate plasma reactor. Such a reactor is shown schematically in FIGS. 2a and 2b. The apparatus includes a heater block 280 that supports six semiconductor substrates 200 in a reactor chamber. The reactant gases enter the reaction chamber through one of six individual showerheads 290, each suspended above a corresponding semiconductor substrate 200. The reactant gases flow through the showerhead holes into the plasma region 300 and across the face of the semiconductor substrate 200. A high frequency (13.56 MHz) RF power source is coupled to the showerhead 290, and a low frequency (250 KHz) RF power source is coupled to the heater block 280.

The semiconductor substrate 200 is loaded into the chamber 310. The recommended operating temperature of the chamber is 400 degrees Centigrade. Then, the chamber is evacuated and the gas inlet and other outlet lines are purged to clean the system of any unwanted contaminants.

The next step is to introduce the reactant gases silane, ammonia, and nitrogen into the reactor chamber. A silane flow rate of 150 sccm may be used, with gas flow ratios of 1 $SiH_4$:5 $NH_3$:100 $N_2$. The relatively low flow rate of the silane gas, along with the high flow rate of nitrogen (15,000 sccm or 15 lm), will starve the film of silicon, and encourage the replacement of the Si—H bonds with Si—N and N—H bonds. The lowered flow of ammonia provides for a lesser amount of hydrogen in the reactor for forming Si—H bonds.

The RF power is applied, and induces an oscillatory field in the gas, which accelerates any charged species along the field lines. Thereby, the charged species collide with the neutral species, ionizing the neutral species until a plasma comprising ionized species is formed in the reactor chamber above the substrate 200. The gas precursors decompose in the plasma, and react together on the semiconductor substrate 200 to form the deposited UV transmissive silicon nitride film 270.

The ranges of RF power applied to the apparatus were between 0.10 kW and 0.30 kW for the low frequency power supply, and between 0.5 kW to 0.7 kW for the high frequency power supply. The amount of UV transmittance measured in the films was flat as a function of the high frequency RF power, whereas for the low frequency RF power, the transmittance was observed to rise by a factor of about 50% at the higher power levels (0.3 kW), at a constant rate of silane flow. The film so produced had a compressive stress of about −2.7e9 dynes/$cm^2$. Compressive stress is preferred over tensile stress because it reduces the tendency of the film to delaminate from the substrate.

The reactor pressure is held between 2.0 and 2.5 Torr, e.g., about 2.25 Torr. The reactor pressure is high enough to maintain a stable plasma. Increasing the pressure beyond this range increases the mass flow rate required of the precursor gases. Lower pressures may reduce the deposition rate of the film.

The wafer is heated to a temperature of about 400 degrees Centigrade. Lower temperatures may reduce the deposition rate and increase the pinhole defect density in the resulting film. Increased temperatures tend to be avoided to reduce the thermal budget of the films and transistor structures.

The deposition rate of the UV transmissive silicon nitride film on the substrate is relatively slow, at about 55 nm per minute. However, the resulting film has a very low density of pinhole defects, through which moisture could otherwise be admitted through the film. Secondly, the step coverage of the film is quite good. This is especially important for the topside passivating layer which must cover the substantial topography of the interconnect layer. The good step coverage is likely to be a direct result of the low deposition rate, as the molecules are able to diffuse over the surface of the substrate, to find favorable nucleation sites, rather than just adhering in the most immediate locations. Thirdly, the density of the film is higher than films produced by conventional silicon nitride PECVD processes, which improves its resistance to attack by ionic or other contaminants. Each of these aspects of the film will be discussed further with respect to an associated figure.

Figure 3:
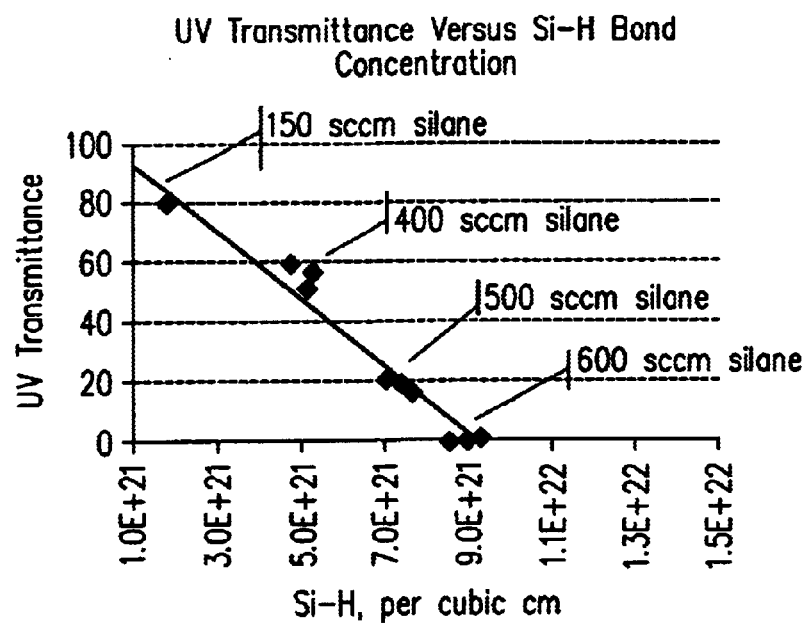
FIG. 3 shows data demonstrating the relationship between the Si—H bond concentration and the UV transmittance.

The data shown in FIG. 3 demonstrates the relationship between the Si—H bond concentration and the UV transmittance of the silicon nitride film. The Si—H bond concentration was measured using Fourier Transform Infrared (FTIR) analysis. The range of data covers conventional silicon nitride, which is formed in a PECVD chamber using 600 sccm of silane, to the UV transmissive silicon nitride formed with 150 sccm of silane. The concentration of Si—H bonds in this regime ranges from nearly 1e22 bonds/cm$^3$ for the conventional silicon nitride film to 2e21 bonds/cm$^3$ for the UV transmissive silicon nitride film formed in accordance with the present invention. As a result, the transmittance varies over this range from very nearly zero for the conventional silicon nitride, to about 80% for the UV transmissive silicon nitride with bond concentration of less than 2e21 bonds/cm$^3$. As can be seen from the data, in order to boost the transmittance of the film, it is necessary to reduce the Si—H bond concentration, as the UV transmittance is inversely proportional to the Si—H bond density.

One method of reducing the Si—H bond concentration is to reduce the availability of Si in the plasma. To this end, the flow rate of the silane precursor is reduced by two to four times, from 500 sccm in the conventional silicon nitride process to 150 sccm in the example inventive process. This reduces the Si—H bond concentration to a range of 2e21 bonds/cm$^3$. For higher silane flows, excess silane species that are not reacted to form the silicon nitride film form Si—H bonds that are incorporated into the silicon nitride film, decreasing the transmittance of the film to UV light. The flow rate of the silane is therefore chosen, in accordance with the present invention, to be high enough to provide an appreciable deposition rate for the resulting UV transmissive silicon nitride film, while being low enough to reduce the concentration of Si—H bonds in the film. The range of acceptable flow rates for the silane may be, for our example configuration, between about 130 sccm to about 180 seem.

Increasing the nitrogen flow into the plasma reactor helps to reduce the Si—H bond concentration by providing additional nitrogen atoms to bond with hydrogen atoms that are produced during the plasma-induced decomposition of the silane and ammonia molecules. The high flow rate of nitrogen encourages the passivation of dangling Si bonds with N rather than H, to create a nitrogen-rich silicon nitride film.

White in the exemplary embodiment, the ratio of silane to nitrogen flow rates was 1:100, it is expected that the nitrogen richness and the other beneficial results obtained herein could be obtained at somewhat greater silane to nitrogen ratios, provided that the amount of silane remains significantly less than the amount of nitrogen. For instance, a ratio of silane to nitrogen flow rates of at most 1:25, or at most 1:50, or 1:100±10% to the PECVD reactor may be expected to provide a nitrogen rich silicon nitride film with acceptable UV transmissivity and other film properties. Of course, process parameters may vary, depending, for instance, on the reactor configuration and desired throughput and film properties. Suffice to say that, within the present invention, the flow rate of nitrogen is significantly greater than the flow rate of the silane, such that the UV transmissive PECVD silicon nitride film so produced has a stoichiometry of $Si_xN_yH_z$, where y>x.

The flow rate of ammonia supplied to the PECVD reactor to produce the UV transmissive silicon nitride film also is reduced compared to the process for making the conventional opaque silicon nitride film. Accordingly, the amount of hydrogen available to form Si—H bonds during deposition of the film is reduced. For instance, the ratio of silane to ammonia flow rates in the conventional process for making opaque silicon nitride process may be 1:8, whereas in an exemplary process for making the UV transmissive silicon nitride, the ratio of silane to ammonia flow rates is 1:5. The nitrogen flow rate is significantly greater than the ammonia flow in the exemplary embodiment.

Figure 4:
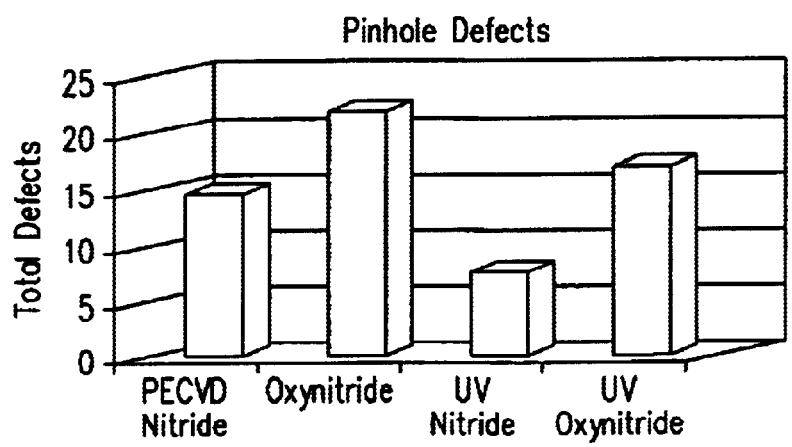
FIG. 4 shows data showing the density of pinhole defects detected in each of four passivating films.

FIG. 4 shows the frequency of occurrence of pinhole defects in four films that are used as passivation layers. The films are, from left to right in FIG. 4, (1) a conventional opaque silicon nitride deposited using PECVD: (2) a conventional opaque silicon oxynitride film deposited using PECVD; (3) my UV transmissive silicon nitride (denoted as "UV nitride" in FIG. 4) formed using the inventive PECVD process described herein; and (4) a high UV transmittance silicon oxynitride film deposited using PECVD (denoted as "UV oxynitride" in FIG. 4). Practitioners will appreciate that conventional silicon oxynitride films are produced like conventional silicon nitride films, except that an oxygen source, e.g., nitrous oxide, is added to the gas flow. UV oxynitride transmissivity is a function of silane flow and nitrous oxide flow. All four films were deposited using the same plasma reactor, albeit at different gas flows and pressures.

To detect the pinhole defects displayed in FIG. 4, the samples were etched in an aluminum wet etch solution, which consisted of $16H_3PO_4$:1 $HNO_3$:1 $H_3NO$:2 $H_2O$, maintained at a temperature of 40 degrees Centigrade, for 10 minutes, and then inspected under an optical microscope. The UV silicon nitride had a total of only about seven pinhole defects in a given inspection area. In contrast, the other passivation films, such as the conventional opaque PECVD silicon nitride and the UV oxynitride had about 15 pinhole defects, and the conventional silicon oxynitride had 22 pinhole defects in the same inspection area. Therefore, it can be concluded that the UV silicon nitride produced according to the process recipe disclosed herein is very good as a barrier film against the aluminum etchant.

Figure 5A:
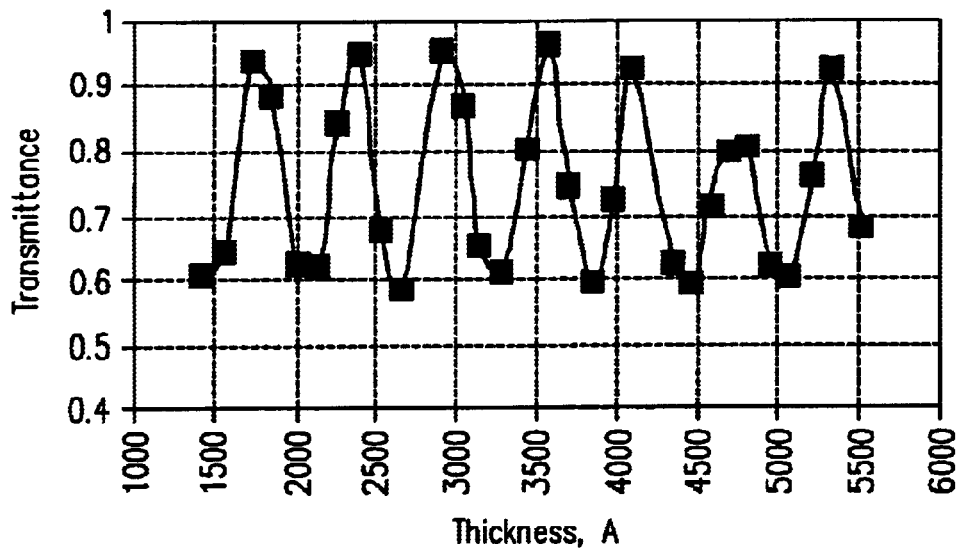
FIG. 5a shows data demonstrating the relationship between the thickness of the passivating film, and its transmittance.
Figure 5B:
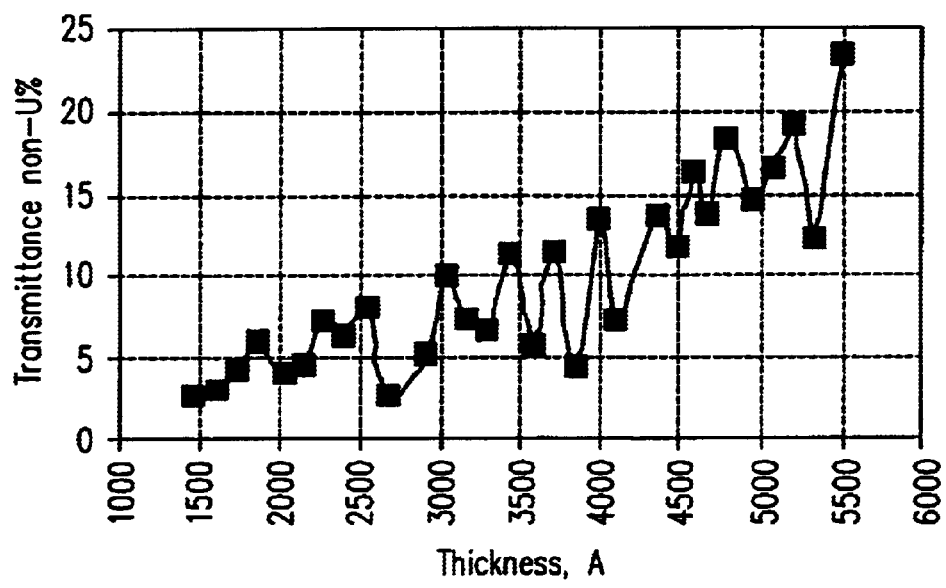
FIG. 5b shows the variability of the UV transmittance as a function of thickness of the silicon nitride film.

FIG. 5a shows data indicating the relationship between the film thickness and its transmittance. It is found that the UV transmittance of the UV transmissive silicon nitride film is a varying function of its thickness, having maxima at 170 nm, 240 nm and 290 nm. At the maxima, the transmittance approaches 1.0, whereas at its minima the transmittance is at about 0.6. Also shown in FIG. 5b is the variability in UV transmittance across the wafer surface. Because of the large variability in UV transmittance for films greater than 300 nm thick, a maximum thickness level of 300 nm is recommended for this process.

Figures 6, 7:
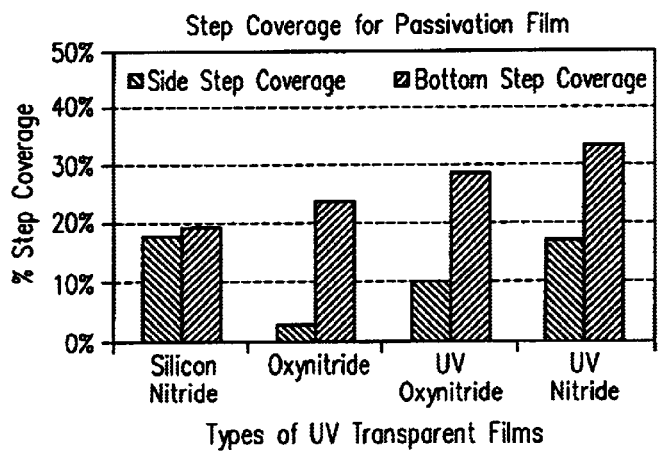
FIG. 6 shows data indicating the quality of step coverage for each of the four passivating films.
FIG. 7 is a table summarizing the parameters of the UV silicon nitride film, compared to the three other passivation films.

FIG. 6 shows the step coverage for the four passivation films listed with respect to FIG. 4. The plot shown in FIG. 6 is a comparison of bottom and sidewall step coverage.

Conventional opaque PECVD silicon nitride films have a sidewall and bottom step coverage of close to 20%. The UV transmissive PECVD silicon nitride film of the present invention has a better bottom step coverage because it has a deposition rate three times lower than the conventional PECVD silicon nitride. Both the silicon oxynitride and the UV oxynitride films have poorer bottom step coverage but good sidewall coverage. Therefore, the UV transmissive silicon nitride film of the present invention shows the best overall step coverage among the four films.

FIG. 7 summarizes the film attributes of the UV silicon nitride, formed according to an embodiment of this invention, compared with the other three passivation films of FIG. 4. As shown in FIG. 7, the PECVD deposition rate of my UV silicon nitride is 55 nm/min, whereas the conventional silicon nitride film has a higher PECVD deposition rate of 185 nm/min respectively. The UV silicon nitride therefore has a deposition rate that is more than three times lower than that of conventional plasma enhanced silicon nitride. The film stress is comparable to that of the conventional silicon nitride, in the range of $-2.3e9$ to $-2.7e9$ dynes/cm$^2$. The UV nitride film has a nitrogen-to-silicon ratio of 1.1 compared to 0.7 in the conventional silicon nitride film. This ratio is reflected in its nitrogen-rich stoichiometry of $Si_3N_xH_y$, wherein $x=3.3$ and $y=1.3$, compared to the conventional silicon nitride film having a stoichiometry of $x=2.125$ and $y=1.125$. Although the difference in hydrogen content is modest (16% compared to 18%), it is sufficient to make a large difference in UV transmittance.

The UV transmissive silicon nitride of the present invention has the lowest etch rate of the four films in a 100:1 buffered oxide etch (BOE) solution, indicating the highest density.

Although the UV oxynitride has a higher deposition rate and higher transmittance, its poorer performance as a passivation layer leads to the choice of the UV silicon nitride as the best overall performer in the group.

The invention is not limited to the exemplary embodiments described above. For instance, the invention is not limited to any particular deposition tool, but can be applied to any plasma enhanced chemical vapor deposition apparatus. Furthermore, process parameters can be varied. Other embodiments and variations are within the scope of the invention, as defined by the appended claims.

Various aspects and features of the present invention have been explained or described in relation to beliefs or theories, although it will be understood that the invention is not bound to any particular belief or theory.

What is claimed is:

1. A method for forming a ultra violet (UV) light transmissive silicon nitride film, comprising:

providing a plasma-enhanced chemical vapor deposition (PECVD) reactor with a semiconductor substrate therein;

flowing a gas mixture comprising silane, ammonia, and nitrogen into the PECVD reactor, wherein a flow rate of the silane is between about 130 sccm and about 180 sccm, and a flow rate ratio of the silane to nitrogen is at most 1:50; and forming a plasma in the PECVD reactor, whereby the UV light transmissive silicon nitride film is deposited on the semiconductor substrate.

2. The method of claim 1, wherein forming the plasma comprises simultaneously applying both a low frequency RF power and a high frequency RF power to the plasma reactor.

3. The method of claim 1, wherein the UV light transmissive silicon nitride film has a density of Si—H bonds of about 2e21 bonds/cm$^3$ or less.

4. The method of claim 1, wherein the UV light transmissive silicon nitride film has a greater stoichiometric amount of nitrogen than silicon therein.

5. The method of claim 1, wherein a flow rate ratio of the silane to nitrogen is 1:100±10%.

6. A method for forming a ultra violet (UV) light transmissive silicon nitride film, comprising:

providing a plasma-enhanced chemical vapor deposition (PECVD) reactor with a semiconductor substrate therein;

flowing a gas mixture comprising silane and nitrogen into the PECVD reactor, wherein a flow rate of the silane is between about 130 sccm and about 180 sccm, and a flow rate ratio of the silane to nitrogen is at most 1:50;

forming a plasma in the PECVD reactor, whereby the UV light transmissive silicon nitride film is deposited on the semiconductor substrate, said UV light transmissive silicon nitride film having a stoichiometric composition comprising $Si_xN_yH_z$, wherein $y>x$, and a UV transmissivity of at least 60%.

7. The method of claim 6, wherein the gas mixture further comprises ammonia.

8. The method of claim 2, wherein forming the plasma comprises simultaneously applying both a low frequency RE power and a high frequency RE power to the plasma reactor.

9. The method of claim 6, wherein the UV light transmissive silicon nitride film has a density of Si—H bonds of about 2e21 bonds cm$^3$ or less.

10. The method of claim 6, wherein a flow rate ratio of the silane to nitrogen is 1:100±10%.

* * * * *